US008825459B2

(12) United States Patent
Aish et al.

(10) Patent No.: US 8,825,459 B2
(45) Date of Patent: Sep. 2, 2014

(54) MULTI-MODAL MANIPULATION OF A GEOMETRIC MODEL

(75) Inventors: Roslyn Robert Aish, Winchester (GB); Benjamin Luke Barnes, Herne Bay (GB); Mehdi Roham Sheikholeslami, Burnaby (CA); Benjamin Doherty, Folkestone (GB)

(73) Assignee: Autodesk, Inc., San Rafael, CA (US)

( * ) Notice: Subject to any disclaimer, the term of this patent is extended or adjusted under 35 U.S.C. 154(b) by 294 days.

(21) Appl. No.: 13/306,730

(22) Filed: Nov. 29, 2011

(65) Prior Publication Data

US 2012/0179430 A1 Jul. 12, 2012

Related U.S. Application Data

(60) Provisional application No. 61/417,808, filed on Nov. 29, 2010.

(51) Int. Cl.
*G06G 7/48* (2006.01)
(52) U.S. Cl.
USPC .............................................................. 703/7
(58) Field of Classification Search
USPC ............ 703/1, 2, 6, 7, 14; 345/418, 419, 619; 700/182
See application file for complete search history.

(56) References Cited

U.S. PATENT DOCUMENTS

| 2003/0025692 | A1* | 2/2003 | Lu et al. ........................ 345/418 |
| 2005/0203718 | A1* | 9/2005 | Carek et al. ....................... 703/1 |
| 2006/0066609 | A1* | 3/2006 | Iodice et al. .................. 345/419 |
| 2006/0250418 | A1* | 11/2006 | Chartier et al. ............... 345/619 |
| 2008/0269942 | A1* | 10/2008 | Free .............................. 700/182 |
| 2009/0144042 | A1* | 6/2009 | Lorenz et al. ................... 703/14 |
| 2010/0106466 | A1* | 4/2010 | Frohlich et al. .................. 703/2 |

* cited by examiner

*Primary Examiner* — Kandasamy Thangavelu
(74) *Attorney, Agent, or Firm* — Gates & Cooper LLP

(57) ABSTRACT

A method, apparatus, article of manufacture, and computer readable storage medium provide the ability to create a geometric model in a computer-aided design (CAD) application. Direct graphical manipulation via user interaction is used to create the geometric model in the CAD application. The direct graphical manipulation is captured, without additional user input, as one or more lines of script code as if the user is writing the script code. The captured script code is integrated into an environment hosted by the CAD application. The script code is then displayed where it can be modified. The modification of the script code acts to modify the geometric model.

18 Claims, 11 Drawing Sheets

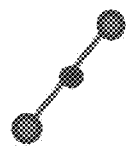
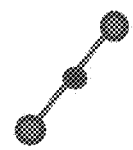
FIG. 8A    FIG. 8B
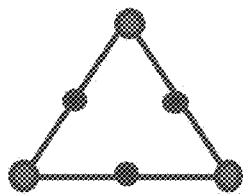
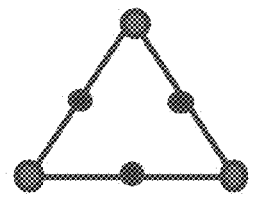
FIG. 8C    FIG. 8D
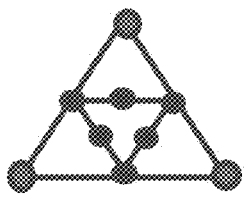
FIG. 8E
FIG. 9

MULTI-MODAL MANIPULATION OF A GEOMETRIC MODEL

CROSS-REFERENCE TO RELATED APPLICATIONS

This application claims the benefit under 35 U.S.C. Section 119(e) of the following and commonly-assigned U.S. provisional patent application(s), which is/are incorporated by reference herein:

Provisional Application Ser. No. 61/417,808, filed on Nov. 29, 2010, by Robert Aish, Benjamin Luke Barnes, and Mehdi Roham Sheikholeslami, entitled "DESIGN SCRIPT, A MULTI-PROGRAMMING PARADIGM LANGUAGE SYSTEM,".

BACKGROUND OF THE INVENTION

1. Field of the Invention

The present invention relates generally to a type of computer programming language which combines multiple programming paradigms (such as with object-oriented, functional, procedural), with a novel programming paradigm based on graph based dependencies (referred to as 'associative' programming). This type of language had been initially implemented or embodied in a language called DesignScript (DS). For the purpose of this patent application and without losing the generality, embodiments of the invention are embodied in the DesignScript programming language. Other programming languages may be utilized (with alternative semantics, syntax and execution). DesignScript, in addition to supporting generally accepted programming facilities and conventions, offers additional facilities not found in other programming languages, specifically a novel "associative" programming paradigm based on graph based dependencies as well as a unique relationship between the DesignScript language, the user interface, and user interaction.

At the semantic level, the facilities supported by the DesignScript language allows for the representation of data, logic and dependencies which offers advantages over conventional programming languages. Aspect of the invention relate to the way the language supports the representation of graph based dependency logic. Another aspect provides that the semantics used to represent the graph based dependency logic can also be combined with other semantics associated with object-oriented, functional, procedural and declarative programming paradigms to form an integrated programming environment. Further, this integrated programming environment (combining powerful aspects of one or more programming paradigm) conveniently allows different aspects of a single or group of related computational problems to be conveniently represented and executed as a single or related group of programs in novel ways not supported by existing programming languages.

At the syntactical level, the facilities supported by the language allow for a notation that is both more succinct than existing languages and also more understandable and accessible to both experienced and novice programmers. Alternative embodiments of this invention (for example, as implemented by other programming languages) may use different notation and syntax, but would allow for the representation and execution of the same logic and semantics that are at the core of this invention. An additional aspect of this invention is not just that the language supports the representation of graph based dependency logic but that the syntax can be combined with other syntax associated with procedural and declarative programming languages.

At the program execution level, the facilities supported by DesignScript language provide for a more efficient "graph based" propagation execution than is implemented in conventional programming language systems. A further aspect of this invention is not just the graph based execution but that this method of execution can be combined with other executions methods associated with procedural and declarative programming languages.

2. Description of the Related Art

Embodiments of the invention overcome many of the limitations of the currently available solutions. These current solutions are either other programming languages or other computer applications used in the design, analysis, simulation or optimization of artifacts or systems.

There are existing languages that combine object-orientation and procedural programming paradigms (e.g., C++, C#, Java™, etc). There are existing languages that combine procedural and logic programming paradigms (e.g., Poplog™ [http://en.wikipedia.org/wiki/Poplog]). There are existing data formats that allow for associative dependency relations to be defined (e.g., the GenerativeComponents™ data file allows dependencies to be defined in terms of "name-value pairs", and Rhino Grasshopper™ uses XML [extensible markup language] file format). Both GenerativeComponent™ and Rhino Grasshopper™ have related procedural scripting functionality and also allow the use of externally defined procedural programming, via .net™ languages. In addition, existing applications (such as GenerativeComponents™) introduce the concept of "replication."

However, while prior art existing languages and applications may provide useful functionality, it has many limitations. The limitations of the prior art are as follows:

The existing program languages (such as C++, C#, Java™), which support multiple programming paradigm, do not support the representation or execution of dependencies.

The data formats (such as GenerativeComponents™ and Rhino Grasshopper™), which do support the limited representation of dependencies, do not qualify as programming languages (for example these languages are not Turing-Complete).

In the context of the existing applications described above (which represent dependencies with data formats and rely on external procedural programming languages), the use of the combination of data format and programming languages has the limitation of forcing the user to use (and to learn how to use) many dissimilar languages and formats (one for dependency modeling and another for procedural programming).

The data format described above (such as GenerativeComponents™ and Rhino Grasshopper™), are verbose and are either awkward for the user to read and edit or are not designed to be human readable/editable. These limitations make it impossible for the user to understand the logic of his/her work in a convenient text notation.

While existing applications (such as GenerativeComponents™) may introduce the concept of "replication," existing application do not provide suitable control facilities for replication above a 2D collection.

In addition to the limitations described above, Rhino Grasshopper™ externalizes data using the standard formats such as XML. However, such externalization is no more than a serialization of the internal data structure. Further, the resulting data is so complex as to be effectively unreadable, let alone editable. For example, when complex data is recorded in the XML format, there is the need to maintain an exact pairing of the start and end delimiter tags. Any mistake in this matching would cause errors, but with such complex data, the "hand-editing" is likely to create such errors, therefore the prospect for such errors would inhibit the most hardened professional programmer, and would make a novice programmer shy away completely.

Further, the amount of the data used by GenerativeComponents™ and Rhino Grasshopper™ is excessive and cumbersome to create, view, and edit. In this regard, Tables 1 and 2 represent an example of a GenerativeComponents™ file and a partial RhinoGrasshopper™ file respectively, that both contain code that attempts to represent the same underlying geometric model, that of two points and a line drawn between these points. The GenerativeComponents™ file (Table 1) has 22 lines and is structured in name-value pair format. The RhinoGrasshopper™ file (e.g., partially illustrated in Table 2) has 239 lines and is structured in XML format.

TABLE 1

```
transaction graphChange 'Consolidation of 2 transactions'
{
    feature User.Objects.point_a Bentley.GC.Features.Point
    {
        CoordinateSystem        = baseCS;
        XTranslation            = 30.0;
        YTranslation            = 40.0;
        ZTranslation            = 0.0;
    }
    feature User.Objects.point_b Bently.GC.Features.Point
    {
        CoordinateSystem        = baseCS;
        XTranslation            = 10.0;
        YTranslation            = 10.0;
        ZTranslation            = 0.0;
    }
    feature User.Objects.myLine0001 User.myLine
    {
        endPoint                = point_a;
        startPoint              = point_c;
    }
}
```

TABLE 2

```
<?xml version="1.0" encoding="utf-8" standalone="yes"
<Archive name-"Root" >
    <!--Grasshopper archive-->
    <!--Grasshopper and GH.IO.dll are copyrighted by XXX -->
    <!--Archive generated by GH_IO.dll file utility library {0.1.0001}-->
    <!--Archive generated on Tuesday, 08 June 2010 10:03:23-->
    <items count="2">
        <item name="archiveVersion" type_name="gh_version"
            type_code="80">
            <Major>0</Major>
            <Minor>1</Minor>
            <Revision>1</Revision>
        </item>
        <item name-"Created" type_name="gh_date"
            type_code="8">634116206036122368</item>
    </items>
    <chunks count="1">
        <chunk name="Definition">
            <items count="1">
                <item name="plugin_version" type_name="gh_version"
                    type_code="80">
                    <Major>0</Major>
                    <Minor>6</Minor>
                    <Revision>59</Revision>
                </item>
            </items>
            <chunks count="3">
                <chunk name="DefinitionHeader">
                    <items count="4">
                        <item name="HandleRhinoEvents" type_name="gh_bool"
                            type_code="1">true</item>
```

TABLE 2-continued

```
                        <item name="HandleHopperEvents" type_name="gh_bool"
                            type_code="1">true</item>
                        <item name="DocumentID" type_name="gh_guid"
                            type_code="9">edd75b33-20aa-403e </item>
                        . . . .
                                . . .
...
```

Therefore, there exists a need for a scripting language that can present a single consistent set of concepts, with a single syntax that addresses the full range of programming requirements. It must be clear, concise, and consistent. It must be easy to adopt and use by users with a broad range of conceptual knowledge and practical programming experience, bearing in mind that many of the users may not be professional programmers and that programming is not their main task but an aspect of some other professional tasks such as architectural design or structural engineering.

SUMMARY OF THE INVENTION

One or more embodiments of the invention provide a type of computer programming language, referred to herein as the DesignScript programming language, that combines multiple programming paradigms with a novel programming paradigm based on graph based dependencies. The DesignScript programming language provides a simple readable structure that may be easily understood and edited by a user. In addition, the DesignScript may be created dynamically without the user editing the code itself merely by the user performing direct graphical manipulation of a geometric model. In this regard, the DesignScript is created by the system as the user interacts with the geometric model. Thereafter, to edit the geometric model, the user can elect to either (1) edit the DesignScript code which will be automatically reflected in the geometric model, or (2) work directly with the geometric model which will be reflected in the DesignScript code.

BRIEF DESCRIPTION OF THE DRAWINGS

Referring now to the drawings in which like reference numbers represent corresponding parts throughout:

FIGS. 8A-8E illustrate an example of geometric views of a nested user defined feature in accordance with one or more embodiments of the invention;

FIG. 9 illustrates an exemplary interface that integrates a marking menu with the formlets in accordance with one or more embodiments of the invention;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
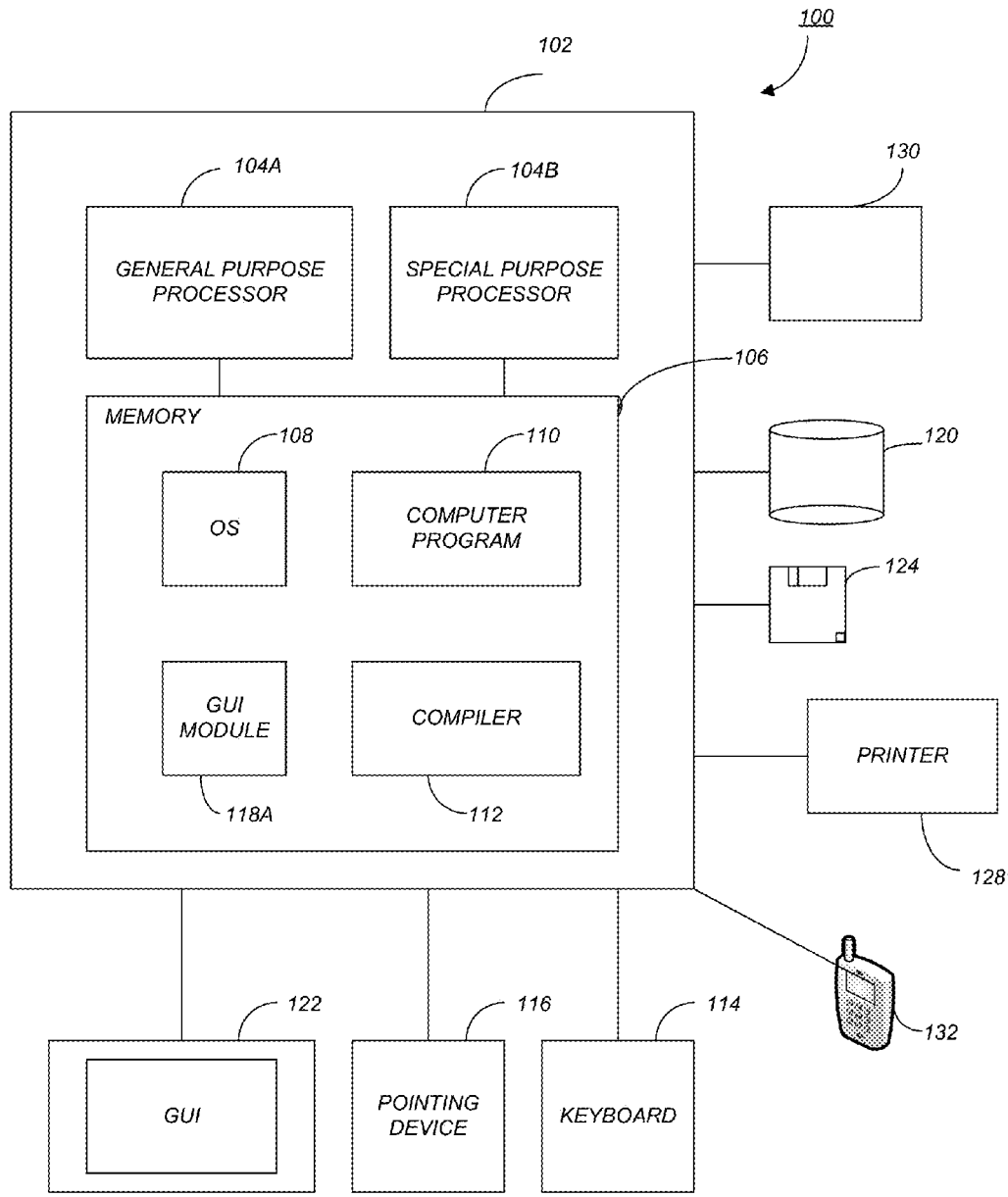
FIG. 1 is an exemplary hardware and software environment used to implement one or more embodiments of the invention.

FIG. 1 is an exemplary hardware and software environment 100 used to implement one or more embodiments of the invention. The hardware and software environment includes a computer 102 and may include peripherals. Computer 102 may be a user/client computer, server computer, or may be a database computer. The computer 102 comprises a general purpose hardware processor 104A and/or a special purpose hardware processor 104B (hereinafter alternatively collectively referred to as processor 104) and a memory 106, such as random access memory (RAM). The computer 102 may be coupled to integrated with other devices, including input/output (I/O) devices such as a keyboard 114, a cursor control device 116 (e.g., a mouse, a pointing device, pen and tablet, touch screen, multi-touch device, etc.) and a printer 128. In one or more embodiments, computer 102 may be coupled to or may comprise a portable or media viewing/listening device 132 (e.g., an MP3 player, iPod™, Nook™, portable digital video player, cellular device, personal digital assistant, etc.).

In one embodiment, the computer 102 operates by the general purpose processor 104A performing instructions defined by the computer program 110 under control of an operating system 108. The computer program 110 and/or the operating system 108 may be stored in the memory 106 and may interface with the user and/or other devices to accept input and commands and, based on such input and commands and the instructions defined by the computer program 110 and operating system 108 to provide output and results.

Output/results may be presented on the display 122 or provided to another device for presentation or further processing or action. In one embodiment, the display 122 comprises a liquid crystal display (LCD) having a plurality of separately addressable liquid crystals. Alternatively, the display 122 may comprise a light emitting diode (LED) display having clusters of red, green and blue diodes driven together to form full-color pixels. Each liquid crystal or pixel of the display 122 changes to an opaque or translucent state to form a part of the image on the display in response to the data or information generated by the processor 104 from the application of the instructions of the computer program 110 and/or operating system 108 to the input and commands. The image may be provided through a graphical user interface (GUI) module 118A. Although the GUI module 118A is depicted as a separate module, the instructions performing the GUI functions can be resident or distributed in the operating system 108, the computer program 110, or implemented with special purpose memory and processors.

In one or more embodiments, the display 122 is integrated with/into the computer 102 and comprises a multi-touch device having a touch sensing surface (e.g., track pod or touch screen) with the ability to recognize the presence of two or more points of contact with the surface. Examples of a multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 102 according to the computer program 110 instructions may be implemented in a special purpose processor 104B. In this embodiment, the some or all of the computer program 110 instructions may be implemented via firmware instructions stored in a read only memory (ROM), a programmable read only memory (PROM) or flash memory within the special purpose processor 104B or in memory 106. The special purpose processor 104B may also be hardwired through circuit design to perform some or all of the operations to implement the present invention. Further, the special purpose processor 104B may be a hybrid processor, which includes dedicated circuitry for performing a subset of functions, and other circuits for performing more general functions such as responding to computer program instructions. In one embodiment, the special purpose processor is an application specific integrated circuit (ASIC).

The computer 102 may also implement a compiler 112 which allows an application program 110 written in a programming language such as COBOL, Pascal, C++, FORTRAN, or other language to be translated into processor 104 readable code. Alternatively, the compiler 112 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 110 accesses and manipulates data accepted from I/O devices and stored in the memory 106 of the computer 102 using the relationships and logic that was generated using the compiler 112.

The computer 102 also optionally comprises an external communication device such as a modem, satellite link, Ethernet card, or other device for accepting input from and providing output to other computers 102.

In one embodiment, instructions implementing the operating system 108, the computer program 110, and the compiler 112 are tangibly embodied in a non-transient computer-readable medium, e.g., data storage device 120, which could include one or more fixed or removable data storage devices, such as a zip drive, floppy disc drive 124, hard drive, CD-ROM drive, tape drive, etc. Further, the operating system 108 and the computer program 110 are comprised of computer program instructions which, when accessed, read and executed by the computer 102, causes the computer 102 to perform the steps necessary to implement and/or use the present invention or to load the program of instructions into a memory, thus creating a special purpose data structure causing the computer to operate as a specially programmed computer executing the method steps described herein. Computer program 110 and/or operating instructions may also be tangibly embodied in memory 106 and/or data communications devices 130, thereby making a computer program product or article of manufacture according to the invention. As such, the terms "article of manufacture," "program storage device" and "computer program product" as used herein are intended to encompass a computer program accessible from any computer readable device or media.

Of course, those skilled in the art will recognize that any combination of the above components, or any number of different components, peripherals, and other devices, may be used with the computer 102.

Figure 2:
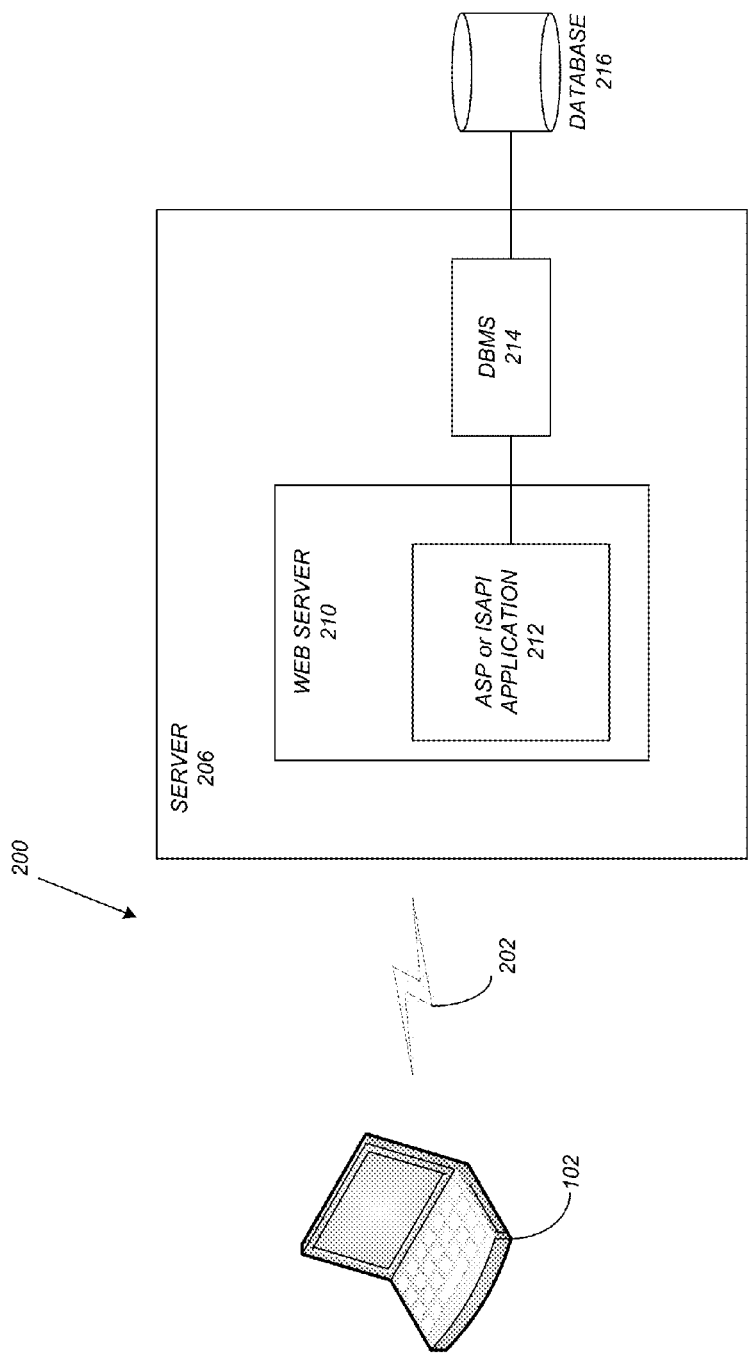
FIG. 2 schematically illustrates a typical distributed computer system using a network to connect client computers to server computers in accordance with one or more embodiments of the invention.

FIG. 2 schematically illustrates a typical distributed computer system 200 using a network 202 to connect client computers 102 to server computers 206. A typical combination of resources may include a network 202 comprising the Internet, LANs (local area networks), WANs (wide area networks), SNA (systems network architecture) networks, or the like, clients 102 that are personal computers or workstations, and servers 206 that are personal computers, workstations, minicomputers, or mainframes (as set forth in FIG. 1).

A network 202 such as the Internet connects clients 102 to server computers 206. Network 202 may utilize ethernet, coaxial cable, wireless communications, radio frequency (RF), etc. to connect and provide the communication between clients 102 and servers 206. Clients 102 may execute a client application or web browser and communicate with server computers 206 executing web servers 210. Such a web browser is typically a program such as MICROSOFT INTERNET EXPLORER™, MOZILLA FIREFOX™, OPERA™, APPLE SAFARI™, etc. Further, the software executing on clients 102 may be downloaded from server computer 206 to client computers 102 and installed as a plug in or ACTIVEX™ control of a web browser. Accordingly, clients 102 may utilize ACTIVEX™ components/component object model (COM) or distributed COM (DCOM) components to provide a user interface on a display of client 102. The web server 210 is typically a program such as MICROSOFT'S INTERNENT INFORMATION SERVER™.

Web server 210 may host an Active Server Page (ASP) or Internet Server Application Programming Interface (ISAPI) application 212, which may be executing scripts. The scripts invoke objects that execute business logic (referred to as business objects). The business objects then manipulate data in database 216 through a database management system (DBMS) 214. Alternatively, database 216 may be part of or connected directly to client 102 instead of communicating/obtaining the information from database 216 across network 202. When a developer encapsulates the business functionality into objects, the system may be referred to as a component object model (COM) system. Accordingly, the scripts executing on web server 210 (and/or application 212) invoke COM objects that implement the business logic. Further, server 206 may utilize MICROSOFT'S™ Transaction Server (MTS) to access required data stored in database 216 via an interface such as ADO (Active Data Objects), OLE DB (Object Linking and Embedding DataBase), or ODBC (Open DataBase Connectivity).

Generally, these components 200-216 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the term "user computer", "client computer", and/or "server computer" is referred to herein, it is understood that such computers 102 and 206 may include thin client devices with limited or full processing capabilities, portable devices such as cell phones, notebook computers, pocket computers, multi-touch devices, and/or any other device with suitable processing, communication, and input/output capability.

Of course, those skilled in the art will recognize that any combination of the above components, or any number of different components, peripherals, and other devices, may be used with computers 102 and 206.

Software Overview

Embodiments of the invention are implemented as a software application 110 and/or as a GUI module 118A on a client 102 or server computer 206. Embodiments of the invention may be implemented as a scripting language that is interpreted by an interpreter (as described above) or may be compiled by complier 112 prior to execution.

DesignScript can operate as a standalone language. However, many of the concepts and functionality of DesignScript are intended to work together with geometric modeling and other functionality found in interactive computer aided design (CAD) systems. Therefore, the relationship between DesignScript to the user interface and to user interaction is very significant. In addition to a unique user interface, embodiments of the invention may exhibit one or more of the following properties:

All aspects of direct graphical manipulation on the part of the user can be captured in DesignScript;

Many of the constructs available in DesignScript can be driven by user interaction; and The are some aspects of DesignScript notation that may be better defined and controlled in the form of text notation. These are supported via a special IDE (Integrated Development Environment).

Bi-Directional Relationship Between the Scripting Language and User Interaction.

Embodiments of the invention provide for a bi-directional relationship between the scripting language and the user interaction. Existing associative applications (such as GenerativeComponents™ and Rhino Grasshopper™) allow the user's interaction to be recorded in their respective file formats. The Rhino Grasshopper™ file format uses XML, which is practically impossible to accurately edit. The Generative-Component™ application allows for some editing of the source code.

One unique of embodiments of the present invention is the integration of the scrip into a CAD host environment (e.g., AutoCAD™ available from the assignee of the present application) which allows for both:

The user's modeling activity (via direct manipulation of the geometric model) and other interactions to be captured in the scripting language; and The user is able to edit the resulting source file and create or modify the geometric model.

The integration of the script implementation into a CAD host environment is facilitated because the syntax of the script is far more compact and comprehendible than other competing applications. In embodiments of the present invention, there is no imposed separation between the user interaction via interface and writing script for creating a model. The user can choose between the direct modeling and writing a script to create a model without being worried about its footprint on the system. In other CAD applications, this distinction is imposed on the users from the initial states of the design. In other words, different user's interaction with the system is captured differently by these systems. However, embodiments of the invention blur this difference by capturing all of the user's direct interaction with the model as lines of code as if the user is writing the code.

User Interaction Controlled State Machine

Figure 3A:
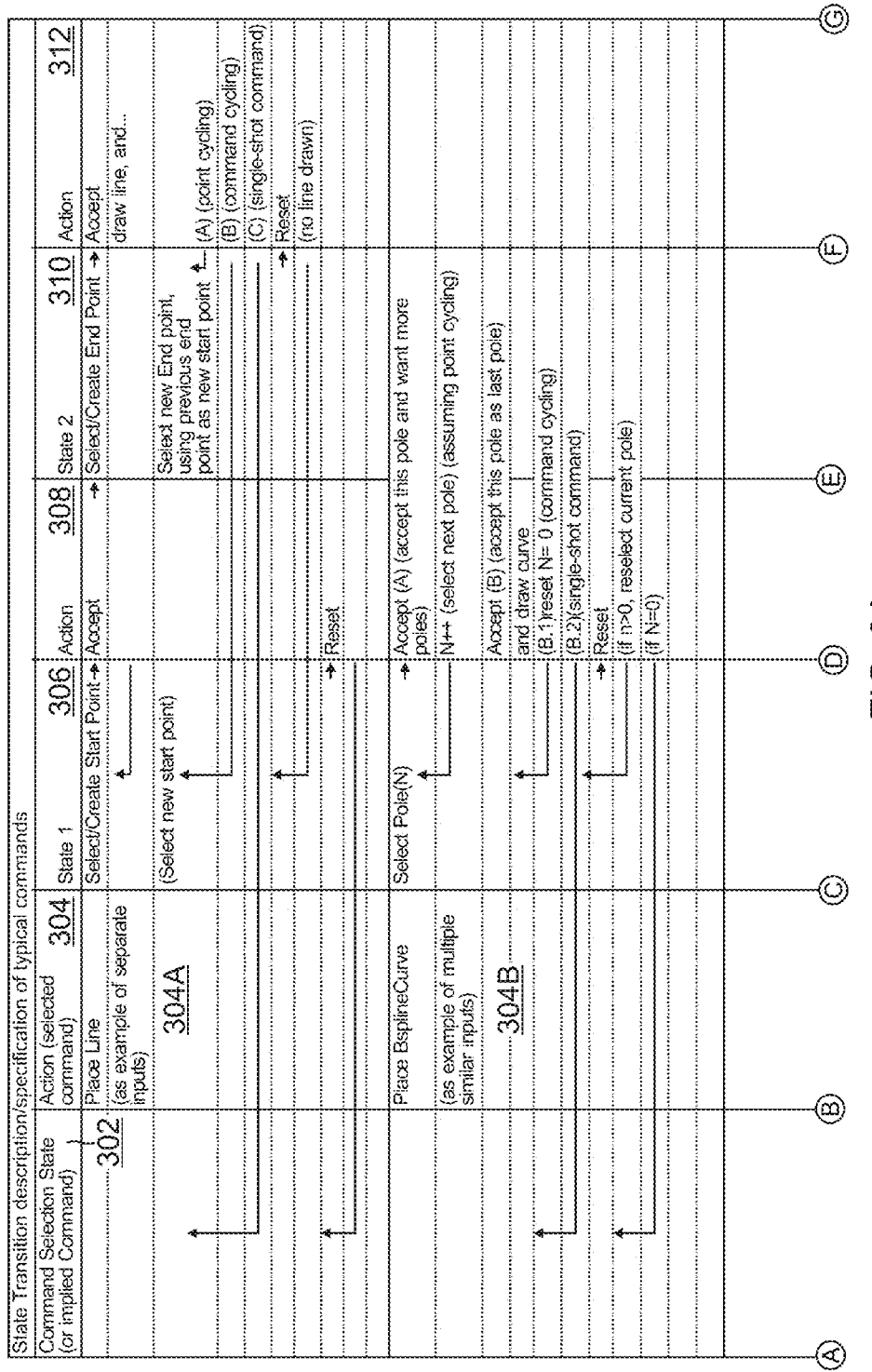
FIGS. 3A-3B illustrate the state transition description/specification of typical commands in accordance with one or more embodiments of the invention.
Figure 3B:
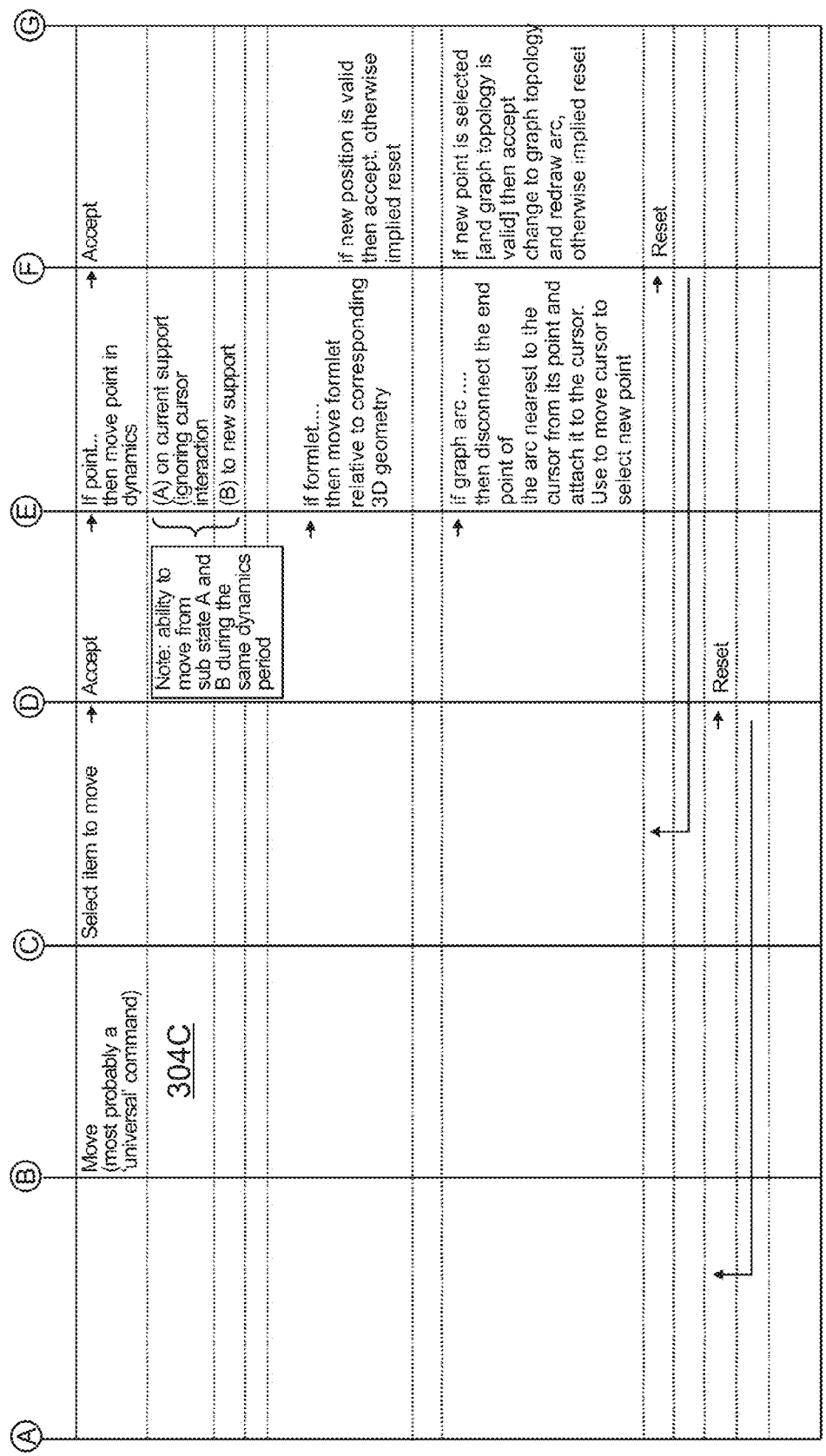

A state machine may be utilized to demonstrate the affect of user interaction. In this regard, user interaction may be controlled by reflection on the available classes and methods. Such reflection drives an interaction state machine. FIGS. 3A-3B illustrate the state transition description/specification of typical commands in accordance with one or more embodiments of the invention. Columns 302, 306, and 210 represent the different states. Columns 304, 308, and 312 represent typical commands that can be used to catalyze a state transition.

Column 302 represents the command selection state (or implied command) where the system is in waiting for the invocation of a particular command or action.

Column 304 illustrates the invocation of various commands including the place line command 304A, place b-spline curve command 304B, and the move command 304C. The place line command 304A is used as an example for placing a line using separate inputs. Once invoked, the first state (state 1 306) is that of selecting/creating a start point or selecting a new starting point. The second state 310 is the state of selecting/creating the end point (or selecting a new endpoint, and using a previous end point as the new starting point). To transition from state 1 306 to state 2 310, the user/action 308 merely needs to accept the selected/created start point. To transition out of state 2 310 back to the command selection state or back to state 1 306, action 312 is that of drawing the line, and performing one of four (4) different actions 312. Action 312A provides for cycling the points (i.e., enabling the selection of a new end point, and using the previous end point as the new start point) thereby remaining in State 2 310. Action 312B provides for command cycling wherein the system transitions back to state 1 306 for the selection of a new start point (i.e., the command to place the line is repeated again). Action 312C provides for a single-shot command (i.e., the command to place the line is only performed once), and transitions to the command selection state 302 waiting for a new command. A reset command may also be performed where no line is drawn and the system reenters state 1 306. In this regard, anytime a reset command is invoked, the system resets to the command selection state 302.

Action 304B provides for placing a b-spline curve as an example of multiple similar inputs. Upon invocation of the command, state 1 306 is entered for the selection of a pole. Various actions may be used to transition from state 1 306 back to the command selection state 302 or to remain in state 1 306. If the user accepts the pole and desires more poles, the next pole is selected (assuming point cycling), and the system remains in state 1 306. If the pole is accepted as the last pole and a curve is drawn, the user may either indicate command cycling (i.e., to place another b-spline curve) or a single-shot command. If the user desires to place another b-spline curve, the pole section set is reset to zero (0) and the action for selecting a point is initiated. However, if a single-shot command is desired (i.e., the user only desires to place a single b-spline curve), the command selection state 302 is entered. Lastly, a reset command can be used to either trigger the selection of an additional point (i.e., the system remains in state 1 306), or can be used to transition the system back to the command selection state.

The move action 304C is used as an example of a universal move command. The invocation of the selected command 304C places the system in state 1 306 for the selection of an item to move. If the selected item is selected, the system transitions to state 2 310. In state 2 310, the user can perform various actions. If the selected item is a point, there are two substates A and B. Substate A provides for moving the point dynamically on the current support (e.g., ignoring the cursor interaction). Substate B provides for moving the point to a new support.

If the selected item is a formlet, then the formlet is moved relative to the corresponding 3D geometry. If the new position of the formlet is valid, the position is accepted, otherwise, an implied reset action may be utilized to reset back to state 1 306 or the command selection state 302. If the selected item is a graph arc, the end point is disconnected and connected to the cursor which is used (by the user) to specify the new move location. If the new location is selected (and the graph topology is valid), the change to the graph topology is accepted and the arc is redrawn. Alternatively, an implied reset may be invoked to reset the user to state 1 306 or the command selection state 302.

Accordingly, the state machine of FIGS. 3A-3B illustrate how the reflection of the available classes and methods can be used to control user interaction.

Integration of Symbolic Model with 3D Geometric Modeling

Existing applications use symbolic graph models in a 2D display. Existing similar applications in this domain use a graph or diagram of the model in isolation either in another window or a separate place in the model view.

In contrast to the prior art existing application, embodiments of the present invention may generate a symbolic model in a number of different configurations:

- As a hierarchical tree structure (similar to a feature tree display);
- As a 2D graph built on a 2D plane and displayed in a separate view; and/or
- As a 2D graph displayed "in canvas" and effectively "draped" over the 3D geometric model such that each node of the 3D graph is placed somewhat approximate to the corresponding geometry in the model (if any).

Figure 4:
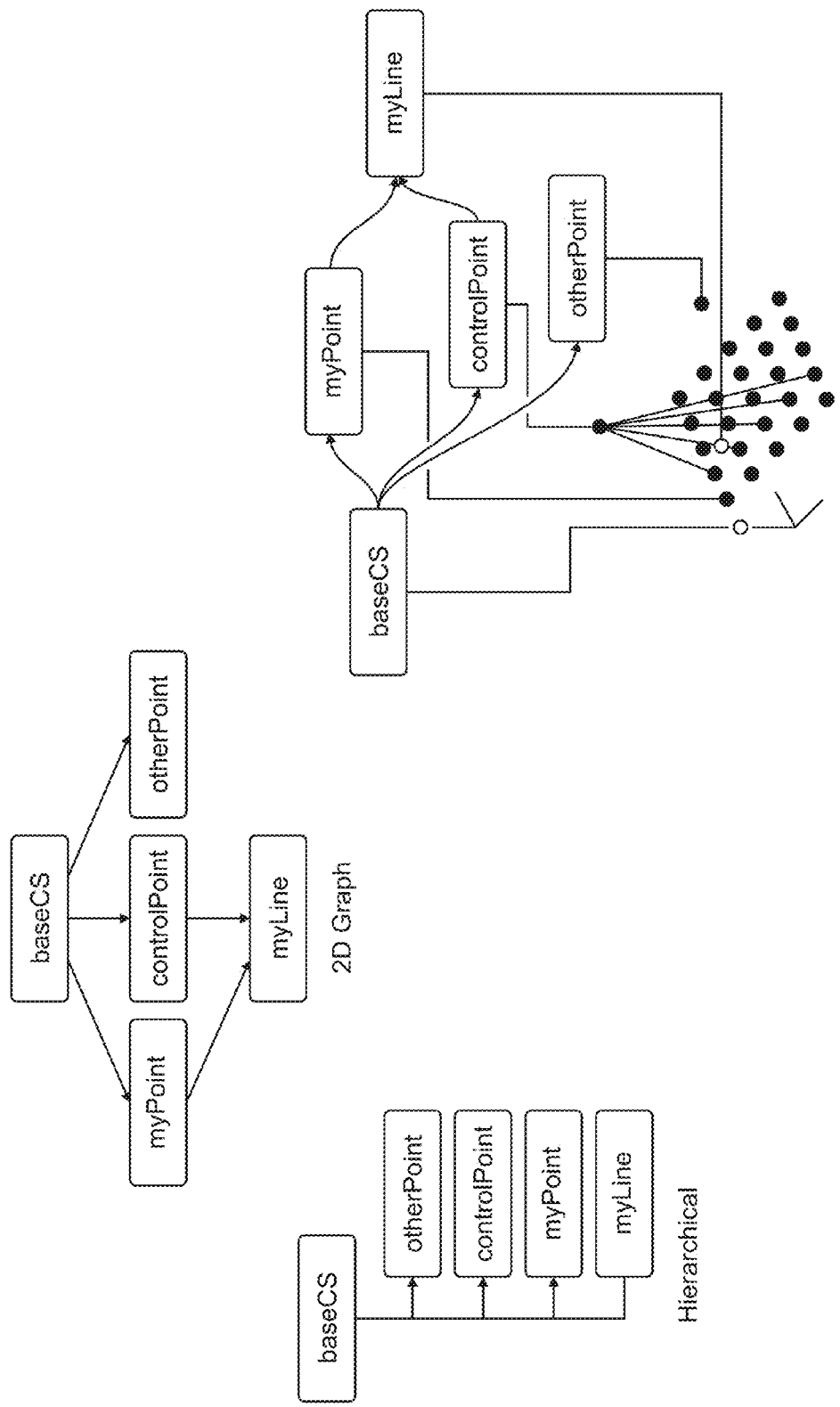
FIG. 4 illustrates various different possible configurations of a symbolic model in accordance with one or more embodiments of the invention.

FIG. 4 illustrates various different possible configurations of a symbolic model in accordance with one or more embodiments of the invention. The leftmost image of FIG. 4 illustrates a hierarchical configuration, the center image illustrates a 2D graph, and the rightmost image illustrates a 2D graph draped over a 3D model.

Some of the existing applications allow users to "manually" position each node of the symbolic model, or to use graph layout routines. Each approach has important limitations. It is arduous for the user to manually control the layout of each graph node in the symbolic mode, particularly when new nodes are introduced and many nodes may need to moved and re-arranged. Automatic node layout algorithms often produce unsatisfactory results bearing in mind that it's the layout of the symbolic model which provides its ability to communicate the "logic" of the dependency model to the user. Abrupt changes in layout, often associated with automatic layout algorithms often disrupt the user's interpretation of the dependency relationships.

In contrast, embodiments of the present invention enable a unique manner in which to control the layout of the symbolic model. The user can "pin" (or fix) the position of certain key nodes, but not usually all of the nodes. Thereafter, the user can control the layout of the "non-pinned" nodes via different user defined attractor and repulsor "forces." These forces can be defined as:

An attraction between related nodes (representing dependency relationships);
An attraction between a node and its corresponding geometric representation; and/or
A repulsion between un-related nodes.

By varying the strength of these different forces the user can:

Adjust the layout of the symbolic model to suit his/her preferences;
Allow the graph to adapt as new nodes are added, existing nodes removed, or dependencies between nodes change; and/or
Morph the graph from a 2D (planar) graph to the 2D graph that can be draped over the 3D geometric model.

Formlet Integration

Existing applications use graph based symbolic models and separately use conventional dialog boxes and forms (often implemented as part of the windowing user interface of the operating system). Existing applications in this domain use graph based representations of a model in a very limited way. For example, in graphs such as Rhino Grasshopper™, 3D Studio Max™ material browser, SoftImage ICE™ etc., there is a limited support for manipulating the model and its properties by changing the properties provided in each node. For some of these modifications, the user has to go through multiple windows and flyovers to achieve the desired change.

Embodiments of the present invention integrate user dialog boxes into the symbolic model, so that the nodes of the symbolic model can be expanded (under user control) to become "formlets" in which the user can control the amount of information or properties he/she wishes to see.

Figure 5:
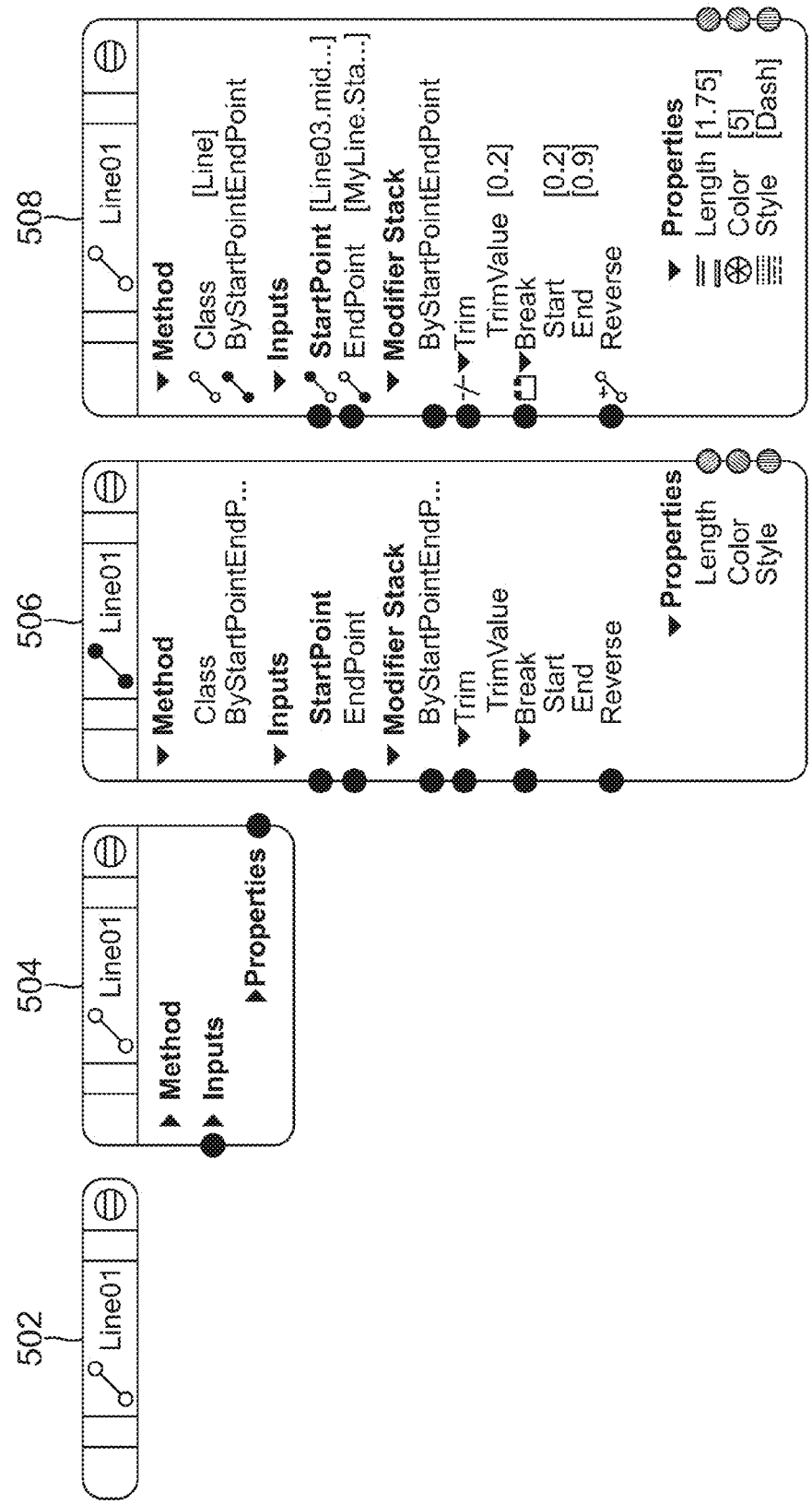
FIG. 5 illustrates formlets with different levels of expansion in accordance with one or more embodiments of the invention.

FIG. 5 illustrates formlets with different levels of expansion in accordance with one or more embodiments of the invention. Formlet 502 merely shows the name of a node, Line01, along with an icon representing the line. Formlet 504 is expanded from formlet 502 and displays the header information for method, inputs, and properties. Arrows indicate that such headers can be further expanded. In addition, small circles indicate input and output ports. Thus, in 504, various inputs can be received and the properties can be output.

Formlet 506 is further expanded from formlet 506 and displays the method names, the input names, modifier stack details, and three properties. Formlet 508 is fully expanded and in addition to displaying the information from formlet 506, formlet 508 includes icons and more specific information for each of the methods, modifier stack, and properties.

Figure 6:
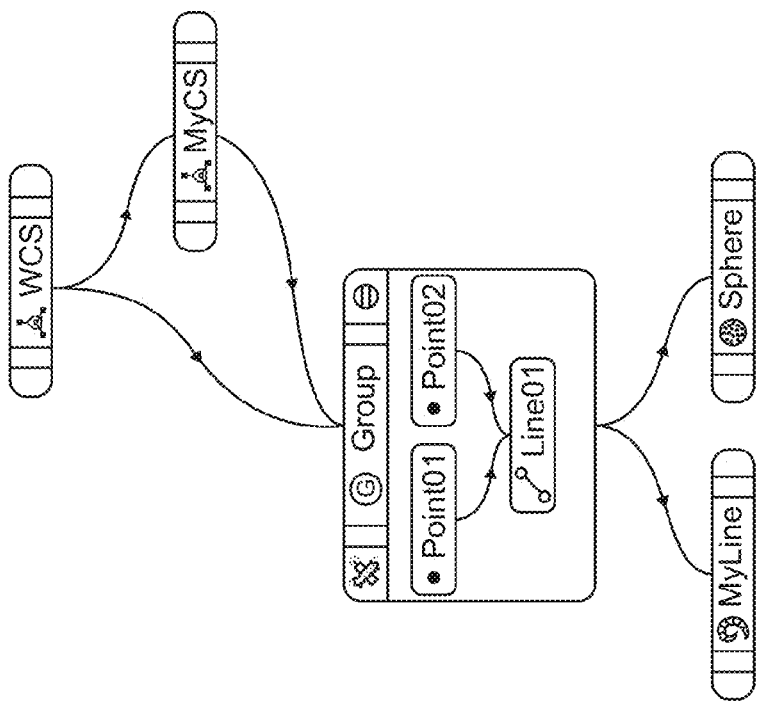
FIG. 6 illustrates a formlet configuration having sub-regions with different formats including a modifier stack, source code/script view, and a graph view in accordance with one or more embodiments of the invention.
Figure 7:
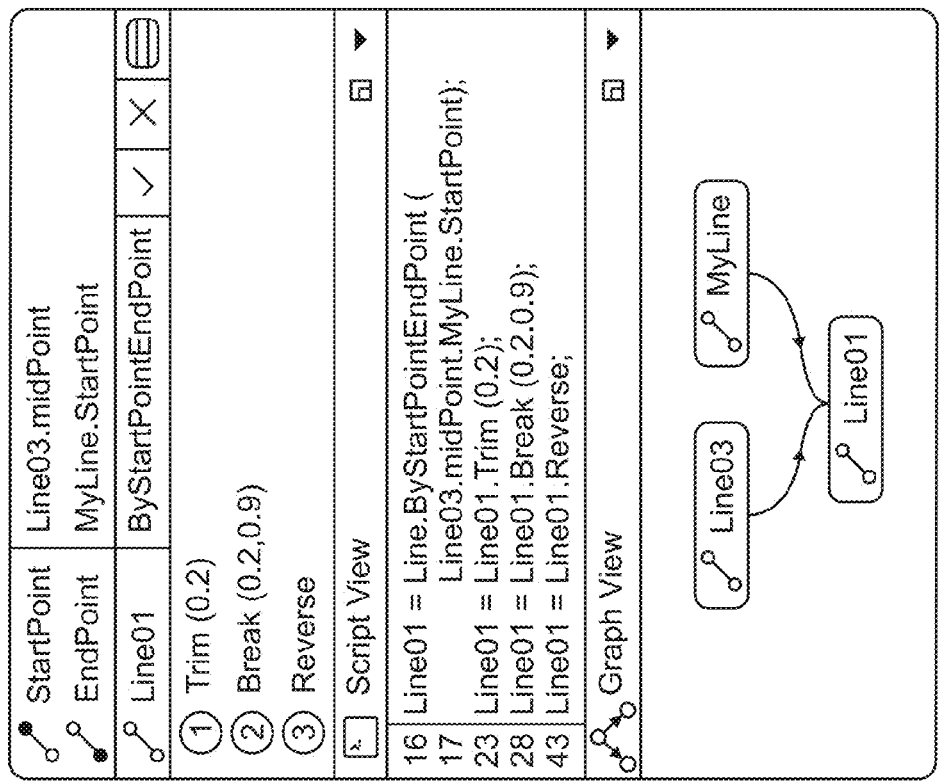
FIG. 7 is an alternative format showing a symbolic model view in accordance with one or more embodiments of the invention.

Alternative formlets may also be utilized. For example, FIG. 6 illustrates a formlet configuration having sub-regions with different formats including a modifier stack, source code/script view, and a graph view. FIG. 7 is an alternative format showing a symbolic model view.

In addition, formlets can optionally contain a view into other geometric models and/or their internal structure. For example, if a node in the graph represents an instance of a user defined feature, and that feature definition was created from a previous graph model, then the view in the formlet can display the 3D geometric or symbolic model of that graph. Such an approach may be fully recursive, so that feature definitions created from models containing instances of other feature definitions can be displayed as a nested set of formlets, with each formlet's geometric view showing the corresponding graph model. This enables the user to navigate through the nested hierarchy of feature definitions and corresponding graph models in a way not previously available.

FIGS. 8A-8E illustrate an example of geometric views of a nested user defined feature in accordance with one or more embodiments of the invention. Each of the geometric views 8A-8E may correspond to a script view illustrating the code used to generate the corresponding geometric view/graph model. In FIG. 8A, a model is created using a regular (as delivered) line and point (e.g., by specifying a starting point, an ending point, a line connecting the starting and ending point, and a mid point).

In FIG. 8B, a line user defined feature is created from the graph model of FIG. 8A (e.g., my defining a line class using the elements used to create the model in FIG. 8A).

In FIG. 8C, the line user defined feature is used to build a triangle model (e.g., by specifying the different points of the triangle [a, b, c] and the sides of the triangle using the line user defined feature).

In FIG. 8D, a triangle user defined feature is created form the graph model of FIG. 8C (e.g., by defining a triangle class using the sides defined in FIG. 8C).

In FIG. 8E, the triangle user defined feature is used to build a nested triangle model (e.g., by defining the points, creating an outer triangle [using the triangle user defined feature and the defined points], and creating an inner triangle from the outer triangle using midpoints of the outer triangle's sides [i.e., using the triangle user defined feature]).

In addition to the above, formlets may be integrated with a marking menu. Many prior art applications may use radial or "marking" menus that provide the users with convenient access to frequently used commands or options. Many applications use forms and dialog boxes to collect data from the user. Embodiments of the present invention integrate a marking menu with formlets, so that when the user has selected different options from the marking menu (in the form of class name and method name) at a particular location on the screen, a formlet is built around this text at the same location. This gives further clarity and convenience to the user. Additionally, it reduces the number of mouse clicks and dialog boxes that the user needs to go through for a particular task. This integration, may also avoid the cognitive shift of tasks for the users to overcome a certain task. FIG. 9 illustrates an exemplary interface that integrates a marking menu with the formlets in accordance with one or more embodiments of the invention. As illustrated, the formlets (e.g., myPoint) are integrated with the toolbar/dialog window.

Progression from Direct Modeling to Associative Modeling to Scripting

Embodiments of the invention provide the ability to use the scripting language in three different modes:

(1) Direct Manipulation (with the geometric model only);
(2) Associative Modeling (with the geometric model and the associative model); and
(3) Scripting (with the geometric mode, the associative (symbolic) model and the IDE).

The progression can be described using an exemplary workflow for creating and using a user defined feature.

One of the key aspects of the functionality of any CAD application is the ability for the user to extend the library of available features (or classes) by creating additional user defined features (or classes). These are usually achieved by assembling a collection of existing entities or primitives. In an associative system this process takes on an additional dimension, that the resulting new definition is not just a static configuration, but has "'behaviour" that is initially based on the behaviour of the existing graph model (or the part of the model) used to define the feature. Accordingly, the user defined feature can be created using a variety of methods including direct modelling, associative modelling, and scripting, each of which is described herein.

Direct Modeling

Figure 10C:
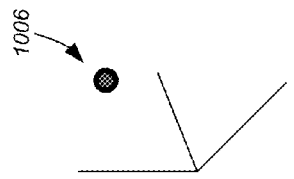
FIGS. 10A-10F illustrate the creation of a user defined feature using direct modeling in accordance with one or more embodiments of the invention.
Figure 10F:
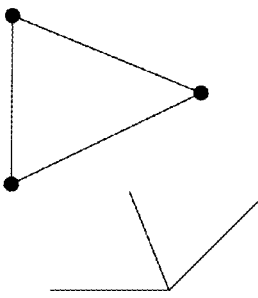
Figure 10B:
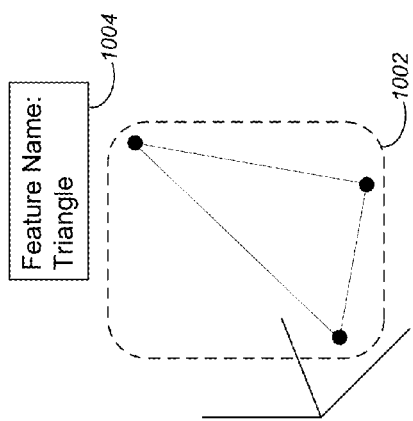
Figure 10E:
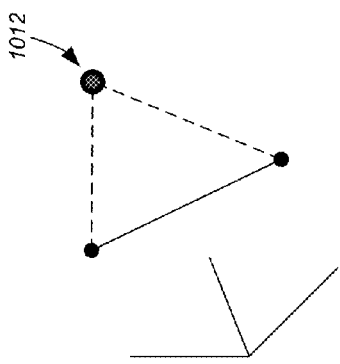
Figure 10A:
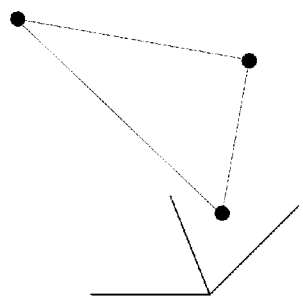

FIGS. 10A-10F illustrate the creation of a user defined feature using direct modeling in accordance with one or more embodiments of the invention. In FIG. 10A, the user creates a "triangle" model based on three (root) points and three dependent lines.

In FIG. 10B, the user selects the model 1002 as the basis for a new feature definition (potentially using a "range" selection). The feature definition process analyzes the selected graph region 1002 and detects that the inputs to the feature are the three (root) points and the feature creates three dependent lines. In addition, the user can create a name 1004 (e.g., "Triangle") for the resulting feature definition.

In FIG. 10C, the user can start with a new (blank) model and invoke the placement of the "Triangle" feature. The user is prompted to select (or create) the initial point input 1006.

Figure 10D:
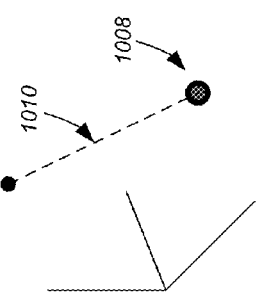

In FIG. 10D, having selected the initial point, the cursor takes on the role of the second input point 1008, allowing a part of the "Triangle" feature to be drawn (in this case one edge 1010).

In FIG. 10E, the selecting (or creating) of the second point now allows the cursor to provide the third (input) point 1012.

In FIG. 10F, the final click to select or create the third (input) point completes the creation of an instance of the new "Triangle" feature. The interactive creation of a new feature definition and the subsequent placement of an instance of the feature can be achieved by "direct modeling" and without the user being aware that the scripting language is operating "under the hood."

Associative Modeling

Figure 11A:
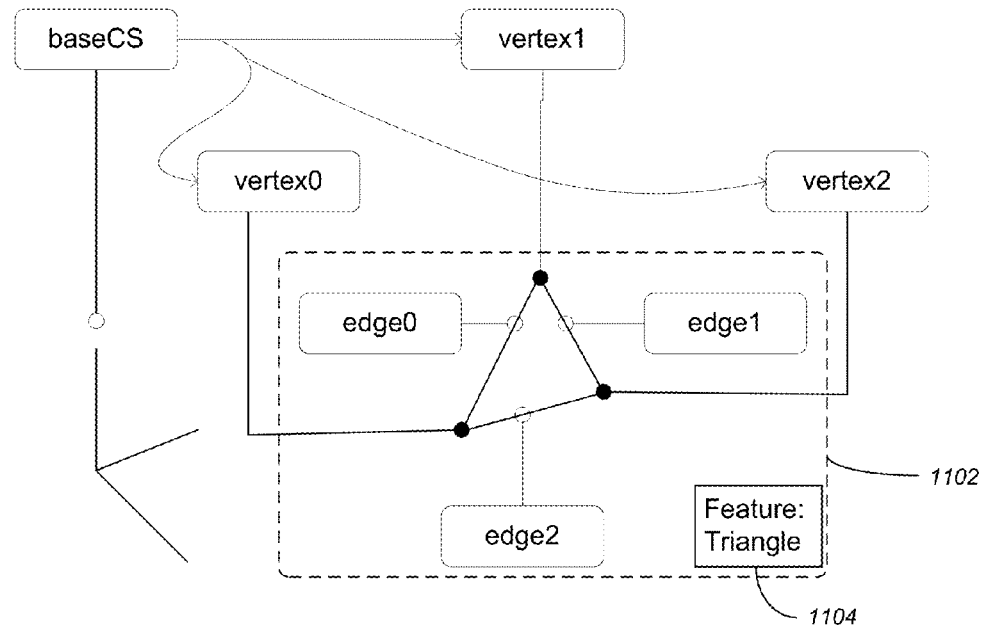
FIGS. 11A and 11B illustrate the creation of a user defined feature using associative modeling in accordance with one or more embodiments of the invention.
Figure 11B:
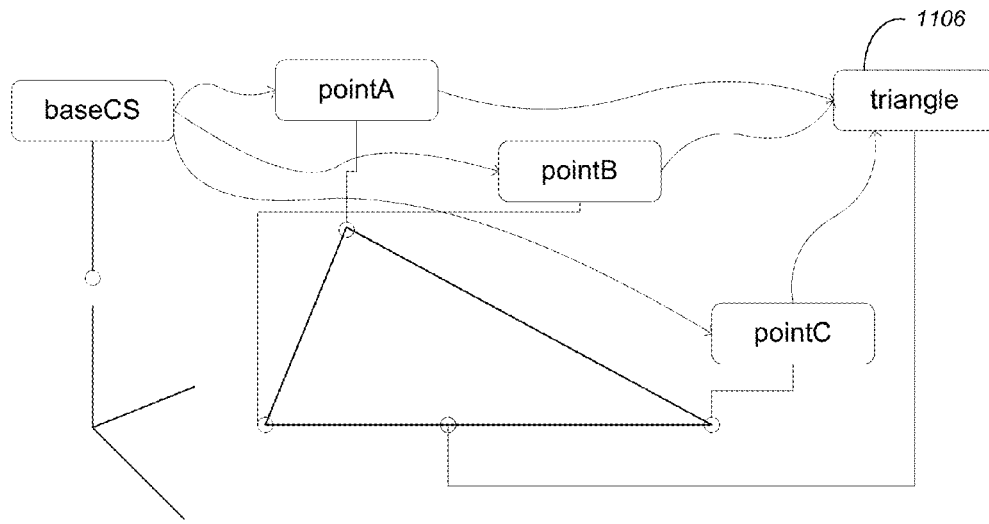

FIGS. 11A and 11B illustrate the creation of a user defined feature using associative modeling in accordance with one or more embodiments of the invention. The user builds the graph of the triangle model using the various nodes and connectors (e.g., baseCS, vertex0, vertex1, vertex2, edge0, edge 1, and edge2). In some model configurations, it may not be possible to show all dependency in the symbolic model and all relationships between each geometric feature and its corresponding symbolic node. In associative modeling, the user has the option (and advantage) to use the symbolic model 1102 to define the region of the graph that will form the new feature definition. In addition, the user can create a name 1104 for the resulting feature definition.

FIG. 11B illustrates the ability for the user to create an instance of the triangle feature, which is represented as a single node 1106 in the graph (and symbolic mode).

Scripting

The original graph model (i.e., of FIG. 10) can be directly transformed into a corresponding feature definition set forth in a script. In this regard, to fashion the triangle in the model, a file may be created and may contain the script code set forth in Table 3:

TABLE 3

```
vertex0=baseCS.pointByCoordinates(5,5,0);
vertex1=baseCS.pointByCoordinates(10,5,0);
vertex2=baseCS.pointByCoordinates(10,10,0);
edge0=Line.ByPoints(vertex0,vertex1);
edge1=Line.ByPoints(vertex1,vertex2);
edge2=Line.ByPoints(vertex2,vertex0);
```

Such script can be used as part of the definition of the user defined feature as illustrated in Table 4 (which includes the direct transformation of the graph model into the feature definition and the instantiation of the feature definition):

TABLE 4

```
Class Triangle
{
    vertex0, vertex1, vertex2 Point;
    edge0=Line.ByPoints(vertex0,vertex1);
    edge1=Line.ByPoints(vertex1,vertex2);
    edge2=Line.ByPoints(vertex2,vertex0);
    Triangle(vertices) {}; //anonymous constructor
}
pointA=baseCS.pointByCoordinates(5,5,0);
pointB=baseCS.pointByCoordinates(10,5,0);
pointC=baseCS.pointByCoordinates(10,10,0);
myTriangle=Triangle(pointA,pointB,pointC);
```

Accordingly, Table 3 illustrates the direct transformation of the graph model as a triangle model is created (e.g., FIGS. 10A-10B). Table 4 illustrates how the resulting feature definition is defined and named "Triangle" based on three (3) vertices (of type Point) and three (3) edges (that are lines connecting the three vertices) (e.g., the steps associated with FIGS. 10A and 10B). Once the feature definition has been defined, the actual triangle can then be created/instantiated using points defined by the actual coordinates (i.e., FIGS. 10C-10F).

Logical Flow

Figure 12:
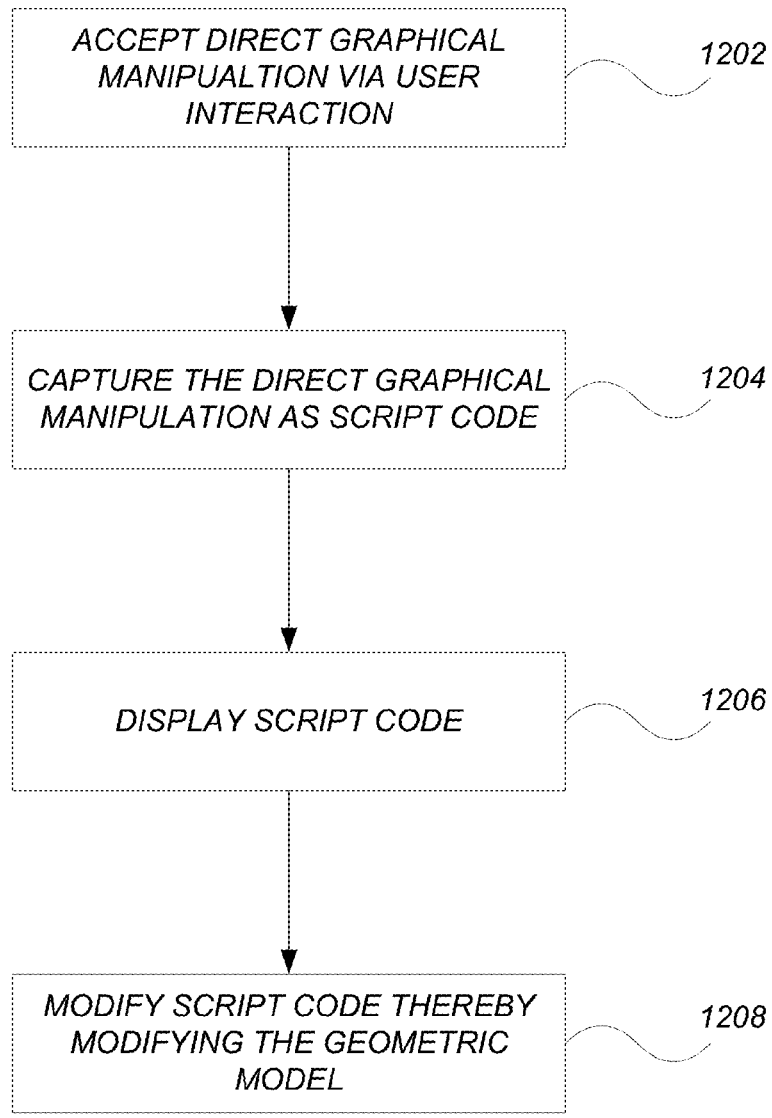
FIG. 12 is a flow chart illustrating the logical flow for creating and editing a geometric model in a CAD application in accordance with one or more embodiments of the invention.

FIG. 12 is a flow chart illustrating the logical flow for creating and editing a geometric model in a CAD application in accordance with one or more embodiments of the invention.

At step 1202, direct graphical manipulation via user interaction is accepted. Such direct graphical manipulation serves to create the geometric model in the CAD application. The user interaction may be controlled by reflection on available classes and methods to drive an interaction state machine.

At step 1204, the direct graphical manipulation is automatically captured (without additional user input) (e.g., dynamically as the direct graphical manipulation is performed/accepted). The manipulation is captured as lines of script code as if the user is writing the script code. Such script code is integrated into an environment hosted by the CAD application. Since the code is captured as if the user is writing the code, the difference between a system that requires the user to choose between direct modeling and writing script to create a model, is blurred.

In addition, the syntax of the script code provides unique attributes that distinguish the present invention from prior art. In this regard, the syntax supports a representation of graph based dependency logic. Further, the syntax can be combined with other syntax associated with procedural and declarative programming languages. The graph based dependency logic may also enable a graph based propagation execution. Such execution can be combined with other execution methods associated with procedural and declarative programming languages.

At step 1206, the lines of script code are displayed. The display may also consist of displaying a symbolic model in a number of different configurations. For example, the symbolic graph model may be generated as a hierarchical tree structure that is displayed in a first view. In addition, the graph model may be generated as a 2D graph built on a 2D plane where the 2D graph has nodes. The 2D graph may be displayed in a separate view from that of the hierarchical tree structure. In a third configuration, 3D graph (e.g., a version of the 2D graph that is morphed into the 3D graph) may be draped over the geometric model where each node of the 3D graph is placed proximate to a corresponding geometry in the geometric model. Such a third configuration may be displayed in a separate view from the other views.

Once displayed, a position of one or more of the nodes in the 2D or the 3D graph may be fixed. The layout of the remaining non-fixed nodes may be controlled based on user defined forces (the strength of which may be adjusted by the user). Such forces may provide for an attraction between related nodes, an attraction between a node and its corresponding geometric representation, and/or a repulsion between unrelated nodes. By adjusting the strength of the forces, the layout of the model can be customized while permitting the graph to adapt as new nodes are added, existing nodes are removed, or dependencies are changed. Further, the forces can be used to morph a 2D planar graph to the 3D graph that is draped over the 3D model (which may also utilize the forces for determining the layout).

At step 1208, the lines of script code are modified thereby modifying the geometric model. Accordingly, the user is able to edit the resulting source code to create or modify the geometric model. Such editing may include creating a user defined feature based on parts of the geometric model. The user defined feature has a behavior based on the parts and represents a graphical feature. Once created, the user defined feature (that is controlled by the script code) can be used to create a new instance of the graphical feature.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for creating a geometric model in a computer-aided design (CAD) application executing in a computer, the method comprising:
accepting direct graphical manipulation via user interaction creating the geometric model in the CAD application;
capturing, as the user interaction is conducted, the direct graphical manipulation, without additional user input, as one or more lines of script code as if the user is writing the script code, wherein the script code is integrated into an environment hosted by the CAD application;
displaying the one or more lines of script code;
modifying the one or more lines of script code thereby automatically modifying the geometric model; and
modifying the geometric model by accepting additional direct graphical manipulation via user interaction with the geometric model, wherein the script code is modified to reflect the modifying.

2. The method of claim 1, wherein:
the one or more lines of script code are comprised of a syntax;
the syntax supports a representation of a graph based dependency logic;
the syntax is combined with other syntax associated with procedural and declarative programming languages;
the graph based dependency logic enables a graph based propagation execution; and
the graph based propagation execution is combined with other execution methods associated with procedural and declarative programming languages.

3. The method of claim 1, further comprising:
controlling the user interaction by reflection on available classes and methods to drive an interaction state machine.

4. The method of claim 1, further comprising:
generating a symbolic graph model of the geometric model as a hierarchical tree structure that is displayed in a first view;
generating the symbolic graph model of the geometric model as a two-dimensional (2D) graph built on a 2D plane, wherein the 2D graph comprises one or more 2D graph nodes, and wherein the 2D graph is displayed in a separate second view; and
generating the symbolic graph model of the geometric model as a 3D graph that is draped over the geometric model, wherein the 3D graph comprises one or more 3D graph nodes, and wherein each 3D graph node is placed proximate to a corresponding geometry in the geometric model.

5. The method of claim 4, further comprising:
fixing a position of one or more of the one or more 2D graph nodes; and
controlling a layout of the one or more 2D graph nodes that are not fixed based on one or more user defined forces, wherein a strength of the one or more user defined forces are adjusted by the user.

6. The method of claim 1, further comprising:
creating a user defined feature based on one or more parts of the geometric model, wherein the user defined feature has a behavior based on the one or more parts, and wherein the user defined feature represents a graphical feature; and
using the user defined feature to create a new instance of the graphical feature, wherein the user defined feature is controlled by the script code.

7. An apparatus for creating a geometric model in a computer-aided design (CAD) application executing in a computer system comprising:
(a) a computer having a memory; and
(b) the CAD application executing on the computer, wherein the CAD application is configured to:
(i) accept direct graphical manipulation via user interaction creating the geometric model in the CAD application;
(ii) capture, as the user interaction is conducted, the direct graphical manipulation, without additional user input, as one or more lines of script code as if the user is writing the script code, wherein the script code is integrated into an environment hosted by the CAD application;
(iii) display the one or more lines of script code;
(iv) modify the one or more lines of script code thereby automatically modifying the geometric model; and
(v) modify the geometric model by accepting additional direct graphical manipulation via user interaction with the geometric model, wherein the script code is modified to reflect the modifying.

8. The apparatus of claim 7, wherein:
the one or more lines of script code are comprised of a syntax;

the syntax supports a representation of a graph based dependency logic;

the syntax is combined with other syntax associated with procedural and declarative programming languages;

the graph based dependency logic enables a graph based propagation execution; and the graph based propagation execution is combined with other execution methods associated with procedural and declarative programming languages.

9. The apparatus of claim 7, further comprising:

controlling the user interaction by reflection on available classes and methods to drive an interaction state machine.

10. The apparatus of claim 7, wherein the CAD application is further configured to:

generate a symbolic graph model of the geometric model as a hierarchical tree structure that is displayed in a first view;

generate the symbolic graph model of the geometric model as a two-dimensional (2D) graph built on a 2D plane, wherein the 2D graph comprises one or more 2D graph nodes, and wherein the 2D graph is displayed in a separate second view; and generate the symbolic graph model of the geometric model as a 3D graph that is draped over the geometric model, wherein the 3D graph comprises one or more 3D graph nodes, and wherein each 3D graph node is placed proximate to a corresponding geometry in the geometric model.

11. The apparatus of claim 10, wherein the CAD application is further configured to:

fix a position of one or more of the one or more 2D graph nodes; and control a layout of the one or more 2D graph nodes that are not fixed based on one or more user defined forces, wherein a strength of the one or more user defined forces are adjusted by the user.

12. The apparatus of claim 7, wherein the CAD application is further configured to:

create a user defined feature based on one or more parts of the geometric model, wherein the user defined feature has a behavior based on the one or more parts, and wherein the user defined feature represents a graphical feature; and use the user defined feature to create a new instance of the graphical feature, wherein the user defined feature is controlled by the script code.

13. A computer readable storage medium encoded with computer program instructions comprising a computer-aided design (CAD) application, which when accessed by a computer cause the computer to load the program instructions to a memory therein creating a special purpose data structure causing the computer to operate as a specially programmed computer, executing a method of creating a geometric model, comprising:

accepting, in the specially programmed computer, direct graphical manipulation via user interaction creating the geometric model in the CAD application;

capturing, in the specially programmed computer, as the user interaction is conducted, the direct graphical manipulation, without additional user input, as one or more lines of script code as if the user is writing the script code, wherein the script code is integrated into an environment hosted by the CAD application;

displaying, in the specially programmed computer, the one or more lines of script code;

modifying, in the specially programmed computer, the one or more lines of script code thereby automatically modifying the geometric model; and modifying the geometric model by accepting additional direct graphical manipulation via user interaction with the geometric model, wherein the script code is modified to reflect the modifying.

14. The computer readable storage medium of claim 13, wherein:

the one or more lines of script code are comprised of a syntax;

the syntax supports a representation of a graph based dependency logic;

the syntax is combined with other syntax associated with procedural and declarative programming languages;

the graph based dependency logic enables a graph based propagation execution; and the graph based propagation execution is combined with other execution methods associated with procedural and declarative programming languages.

15. The computer readable storage medium of claim 13, further comprising:

controlling the user interaction by reflection on available classes and methods to drive an interaction state machine.

16. The computer readable storage medium of claim 13, further comprising:

generating a symbolic graph model of the geometric model as a hierarchical tree structure that is displayed in a first view;

generating the symbolic graph model of the geometric model as a two-dimensional (2D) graph built on a 2D plane, wherein the 2D graph comprises one or more 2D graph nodes, and wherein the 2D graph is displayed in a separate second view; and generating the symbolic graph model of the geometric model as a 3D graph that is draped over the geometric model, wherein the 3D graph comprises one or more 3D graph nodes, and wherein each 3D graph node is placed proximate to a corresponding geometry in the geometric model.

17. The computer readable storage medium of claim 16, further comprising:

fixing a position of one or more of the one or more 2D graph nodes; and controlling a layout of the one or more 2D graph nodes that are not fixed based on one or more user defined forces, wherein a strength of the one or more user defined forces are adjusted by the user.

18. The computer readable storage medium of claim 13, further comprising:

creating a user defined feature based on one or more parts of the geometric model, wherein the user defined feature has a behavior based on the one or more parts, and wherein the user defined feature represents a graphical feature; and using the user defined feature to create a new instance of the graphical feature, wherein the user defined feature is controlled by the script code.

* * * * *